Figure 1:
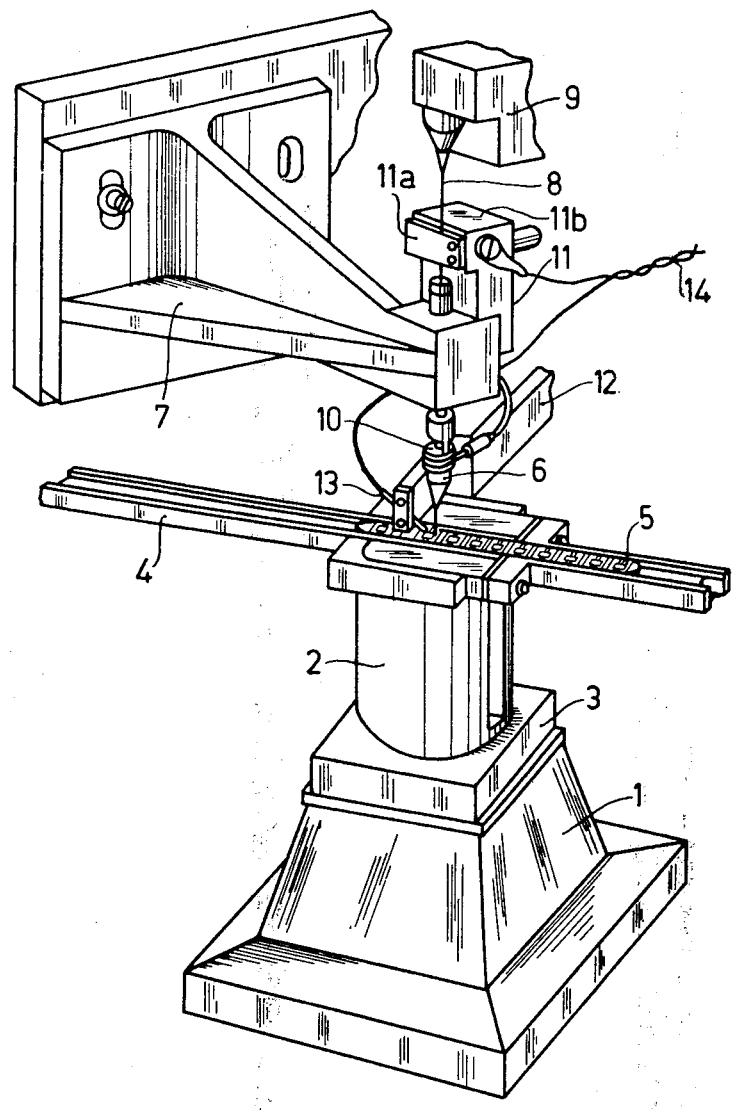

United States Patent [19]

Schmidt et al.

[11] 3,950,631

[45] Apr. 13, 1976

[54] DEVICE FOR WELDING A WIRE BY MEANS OF THERMO-COMPRESSION BONDING

[75] Inventors: Jean Schmidt, Douvres-la-Delivrande; Pierre Brehon, Epron, both of France

[73] Assignee: U.S. Philips Corporation, New York, N.Y.

[22] Filed: Apr. 23, 1973

[21] Appl. No.: 353,375

Related U.S. Application Data

[62] Division of Ser. No. 153,750, June 16, 1971.

[30] Foreign Application Priority Data

June 19, 1970 France .............................. 70.22666

[52] U.S. Cl. ................ 219/107; 219/69 M; 29/178
[51] Int. Cl.² ........................................ B23K 21/00
[58] Field of Search .................. 219/107, 50, 69 M; 29/471.1, 589

[56] References Cited

UNITED STATES PATENTS

| | | | |
|---|---|---|---|
| 2,587,792 | 3/1952 | Van Sivers ............................ | 219/50 |
| 2,679,570 | 5/1954 | Cisne ..................................... | 219/68 |
| 2,759,088 | 8/1956 | Lincoln ............................. | 219/69 M |
| 3,643,321 | 2/1972 | Field et al. ..................... | 29/471.1 X |

*Primary Examiner*—Bruce A. Reynolds
*Attorney, Agent, or Firm*—Frank R. Trifari; David R. Treacy

[57] ABSTRACT

A device for connecting a wire to a support, for example a semiconductor device, by means of thermocompression bonding, by buttwelding, has a movable tool for holding the wire while one end is exposed. An electrode is spaced from the wire end and means are provided for producing a high electric voltage between the electrode and the wire end so as to produce a spark discharge therebetween sufficient to melt the wire end and form a ball. The tool is then used to cause thermocompression bonding.

3 Claims, 3 Drawing Figures

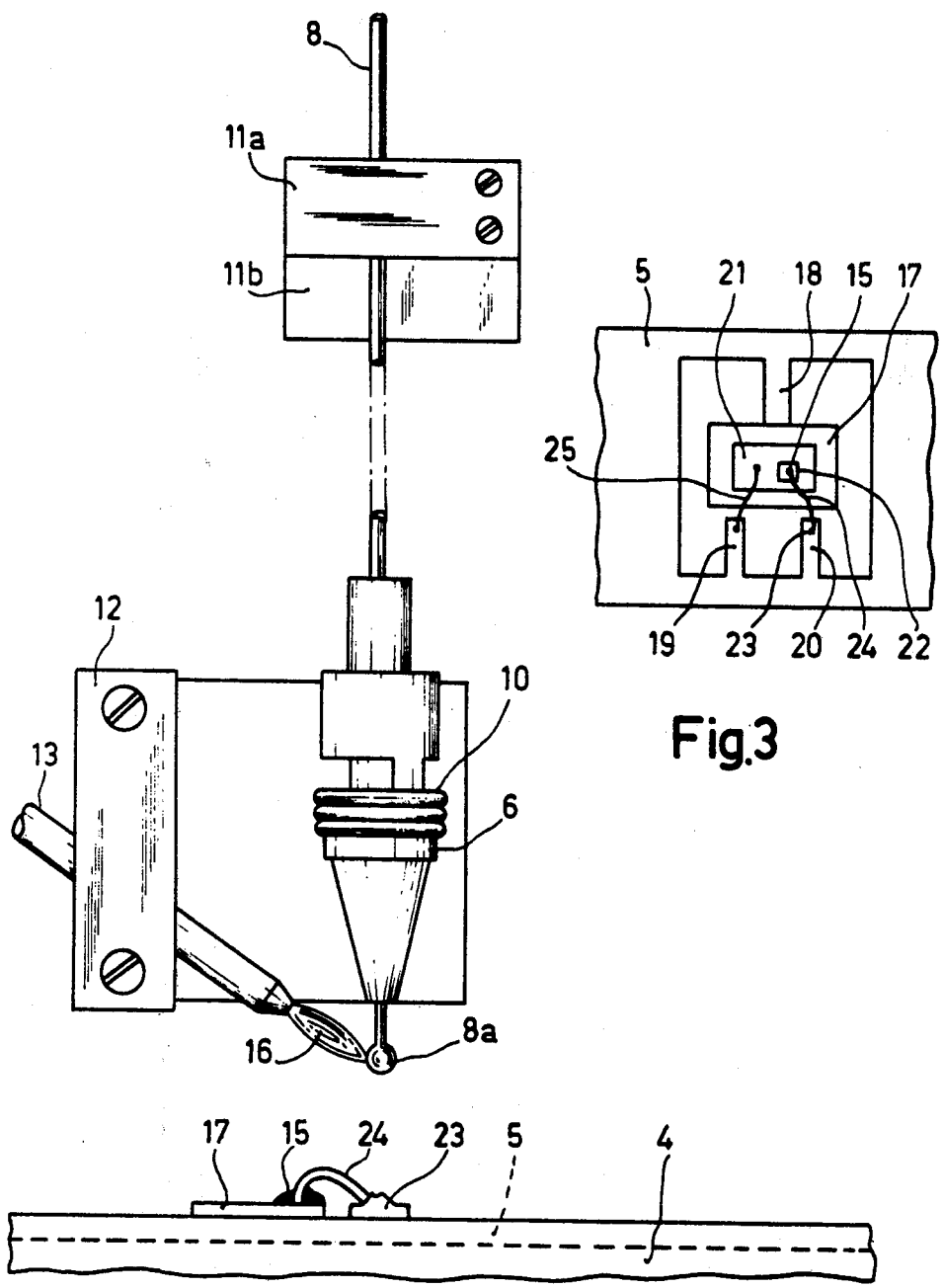

DEVICE FOR WELDING A WIRE BY MEANS OF THERMO-COMPRESSION BONDING

This is a division, of application Ser. No. 153,750, filed June 16, 1971, abandoned.

The invention relates to a device of connecting a wire to a support, for example a semiconductor device, by means of thermocompression bonding, connection is effected by buttwelding a wire which has a ball at a free end. The ball is formed by the localized melting of the wire. Such a method is particularly suitable for connecting connection conductors, which serve to connect certain regions of a semiconductor body of an electronic device, to other elements of said device. In such a case the end of the wire which comprises the ball is generally butt-welded by means of thermocompression bonding on one of the regions of the semiconductor body, the other end of the connection wire being also welded by means of thermocompression bonding but against the side of the wire, for example, on a connection lug of the device.

It is known that after connecting the semiconductor body on a base, electric connections have to be produced between the points of contact of at least a few zones of the semiconductor body and connection elements of the base. The most conventional method for doing this is welding by means of thermocompression bonding of very thin metal wires. In many cases, in particular in integrated circuits, a thermocompression bonding is used which is termed "nail head bonding," in which the free end of the wire which is to constitute the electric connection has a ball approximately in the shape of a nail head due to the thermocompression bonding.

In an apparatus which is suitable for carrying out the method, the welding device comprises a capillary tube, in which the wire can freely move before the electric connections are provided. Simultaneously with cutting the wire, a ball is formed at its end which is intended to form the nail head during the subsequent soldering operation by means of pressure. In these known welding devices the cutting of the wire and the formation of the ball is obtained by localized melting of the wire.

A melting method is known in which the thermal energy of a flame is used, which is supplied permanently by a hydrogen burner but which is directed towards the wire only at the suitable instant. The orientation of the flame is obtained either by directing a jet of oxygen or by a mechanical adjustment of the burner by means of an air cylinder.

Since the cutting of the wire and the formation of the ball at the end of the wire depend upon the outflowing quantity of hydrogen and compressed air, the results are not very accurate and poorly reproducible. In particular, the diameter of the individually formed balls may vary between very wide limits. This is very detrimental since the diameter is an important parameter to obtain a favorable thermocompression bonding. Furthermore, detrition of the guiding device occurs in the case in which the burner is mechanically directed towards the wire, so that a clearance is formed near the burner and a correct orientation of the burner towards the wire cannot be easily obtained.

The operations of cutting the wire and forming the ball are generally carried out after welding the wire to the metallized points of contact on the base. In order to prevent burning of said metallized contact points it is necessary to cut the wire at a larger length than is necessary, in which the non-useful part of the wire may give rise to the formation of shortcircuit with adjacent contact regions.

It is the object of the invention to avoid the said drawbacks. In order to reach the end in view, the ball is produced by an electric spark discharge between two electrodes, one of the two electrodes being the wire itself.

When a ball has been formed at the end of the wire by means of the spark discharge, said ball is welded to a point of contact on the semiconductor device by means of thermocompression bonding a side of the wire is then welded to a second point of contact, place of the device likewise by thermocompression bonding. A pulling force is then exerted on the part of the wire outside the two soldering points so as to break the wire at the region of a notch which has been formed by the thermocompression tool at the height of the second soldering point. Since the wire is cut close to the second soldering point it is possible to remove the wire sufficiently far from the semiconductor device to form a new ball for the next operation, any possibility of burning a part of the semiconductor device being prevented.

The wire which is used as an electrode necessarily is in the path of the electric discharge. No particular adjustment of the mutual position of the electrodes need take place and, if the energy applied between the electrodes remains constant, the results obtained are excellently reproducible.

According to the invention, the device is characterized in that it comprises an electrode which is directed towards the free end of the wire to be connected. The electrode and the wire and connected to a generator which produces pulses of a high voltage. In a favorable embodiment the mechanical means which enable the clamping and pulling of the wire until it breaks conduct electric current and the wire is connected to the generator via said means.

The advantage of such a device relative to a device comprising a burner lies in the fact that the dimensions are very small.

In order that the invention may be readily carried into effect, one embodiment thereof will now be described in greater detail, by way of example, with reference to the accompanying drawings, in which:

FIG. 1 is a perspective view of a part of the device for thermocompression welding in which the electrodes according to the invention are used, FIG. 2 is an elevation on a larger scale of FIG. 1 in which mainly the melting device for the wire is shown as well as the device to clamp and pull loose the wire, FIG. 3 shows a product manufactured by means of the device shown in FIGS. 1 and 2.

The welding apparatus shown in FIGS. 1 and 2 comprises a base 1 on which a cylindrical oven 2 is arranged which is insulated thermally from the base 1 by means of an insulating layer 3. An approximately horizontal guide track 4 is present above the oven 2, in which track semiconductor bodies soldered to a base can move before they form the electronic device. In the embodiment shown in FIG. 3, the semiconductor body 17 is placed on a metal gold-plated strip 5 comprising connection lugs 18, 19 and 20. The connection lug 18 which is in mechanic and electric contact with one of the zones of the semiconductor body 17, alse serves as a support for said body, while the connection lugs 19 and 20 are intended to serve as a connection to the other zones 21 and 22 of the semiconductor body. The strip 5 comprises a number of patterns constituted by the lugs 18, 19 and 20 and it is moved over the guide track 4 by an automatic device not shown in the Figures.

The tool 6 for the thermocompression bonding which is arranged above the guide track 4 and which is supported by an arm 7 which is secured to a micromanipulator (not shown) comprises in its longitudinal direction a continuous bore in which a wire 8 is movable. The wire 8 is supplied from a reel which is held in a holder 9 and serves to form the electric connections between the points of contact on the regions 21 and 22 of the semiconductor body 17 and the connection lugs 19 and 20 of the strip 5. The thermocompression bonding tool 6 can be moved vertically and horizontally by known means (not shown).

The tool 6 is maintained at a constant temperature by means of a few heating coils 10 which are present immediately above the conical operative region of the tool 6.

Between the exit of the holder 9 and the entrance of the bore in the tool 6, the wire 8 passes a clamping device 11 which is rigidly secured to the arm 7 and which is constituted by a flexible strip 11a, which is movable in the direction of a block 11b by suitable means, for example, by exerting pressure on it or by magnetic means.

By means of a brace 12 which is connected to the tool 6, a pointed electrode 13, for example of tungsten carbide, is secured at a suitable distance from the free end of the wire. The electrode 13 and the wire 8, via the clamping device, are electrically connected by means of wires 14 to the output terminals of a pulse generator (not shown) which may comprise, for example, an induction coil which is fed by a continuous current source, an interruptor of the vibratory type being incorporated, either with fixed contacts or with mercury in the primary circuit. Any other embodiment of a generator may also be used which is suitable to supply an increased voltage between its output terminal.

By means of a microcurrent interruptor which is not shown in the Figures, an electric discharge 16 is produced between the electrode 13 and the free end of the wire 8. The energy released at that instant causes a heating of the end of the wire 8 and consequently the melting of said end. By controlling on the one hand the duration of the discharge and on the other hand the distance and the potential difference between the electrode 13 and the wire 8, a sufficiently large energy and temperature can be obtained to form a ball 8a at the end of the wire 8. This ball 8a is pressed against a contact point of the semiconductor body 17, for example the contact point 22, by means of the tool 6, and is secured to it by means of thermocompression bonding while forming a head 15. After uncoupling the clamping device 12, the tool 6 is displaced and the wire 8 which can move in the tool 6 is arranged above a connection lug, for example lug 20, of the strip 5 against which it is forced with its side. The result of this is that a head 23 is formed at the wire, which head is secured to the said connection lug and that the zone 22 and the connection lug 20 are electrically connected together by means of the wire part 24.

During the formation of the head 23 by means of the tool 6, the tool leaves an impression on the end of the wire which forms the beginning of a fracture. The wire 8 is then clamped in the clamping device by holding the strip 11a against the block 11b and the arm 7 with the tool 6 is moved upwards as a result of which the wire 8 is broken at the area of the beginning of the fracture near the connection 23. A new ball 8a is then formed and the process is carried out again, for example, to connect the zone 21 to the connection lug 19 by means of a wire part 25.

What is claimed is:

1. A device for securing a wire to a support element by thermocompression bonding comprising a base for supporting said element, a movably mounted tool for holding said wire so that one end thereof is exposed means for welding said wire to said element by thermocompression bonding, means for supplying wire to said tool and welding means, an electrode located in proximity to the exposed end of said wire, means connected to said electrode and said wire for producing high electric voltage pulses therebetween so as to cause an electric spark discharge between said electrode and said exposed end of said wire sufficient to cause melting thereof thereby forming a ball thereat, means for moving said tool so that said exposed end of said wire having said ball will be in contact with said support element, and means for activating said welding means to weld said wire to said support.

2. The device according to claim 1 wherein said means for producing electric voltage pulses is a pulse generator.

3. The device according to claim 2 further comprising means for placing a notch in said wire after said wire is welded to said support element at approximately the height of said weld, and a movable clamp for clamping said wire and for exerting a pulling force thereon so as to break said wire at said notch, said clamp being electrically conductive so that said pulse generator may be connected to said wire through said clamp.

* * * * *